United States Patent
Kim et al.

(10) Patent No.: US 7,564,068 B2
(45) Date of Patent: Jul. 21, 2009

(54) COG-TYPED ORGANIC ELECTROLUMINESCENT CELL

(75) Inventors: Hak Su Kim, Seoul (KR); Jae Do Lee, Kyongsangbuk-do (KR); Won Kyu Ha, Kyongsangbuk-do (KR)

(73) Assignee: LG Display Co., Ltd., Seoul (KR)

( * ) Notice: Subject to any disclaimer, the term of this patent is extended or adjusted under 35 U.S.C. 154(b) by 410 days.

(21) Appl. No.: 11/204,157

(22) Filed: Aug. 16, 2005

(65) Prior Publication Data
US 2006/0038177 A1    Feb. 23, 2006

(30) Foreign Application Priority Data

Aug. 17, 2004   (KR)   ........................ 10-2004-0064638
Aug. 17, 2004   (KR)   ........................ 10-2004-0064639

(51) Int. Cl.
*H01L 29/18*   (2006.01)

(52) U.S. Cl. ............................. 257/88; 257/89; 438/14; 438/16

(58) Field of Classification Search .................... 257/40, 257/48, 79; 349/40
See application file for complete search history.

(56) References Cited

U.S. PATENT DOCUMENTS 6,750,937 B2 *  6/2004  Karasawa et al. ........... 349/153
7,129,998 B2 * 10/2006  Ohgiichi et al. ............... 349/40

* cited by examiner

*Primary Examiner*—N Drew Richards
*Assistant Examiner*—Paul E Patton
(74) *Attorney, Agent, or Firm*—Birch, Stewart, Kolasch & Birch, LLP

(57) ABSTRACT

The present invention relates to a COG-typed organic electroluminescent device including dummy data lines formed at different location from data lines. The COG-typed organic electroluminescent cell having a plurality of pixels formed in the luminescent areas which are cross areas of indium tin oxide films (ITO films) and metal line layers includes data line pads, dummy data lines, and a dummy data line connecting section. The data line pads each are connected to one end of the ITO films. The dummy data lines each are connected to the other end of the ITO films. The dummy data line connecting section connects the dummy data lines. In the cell, the dummy lines are formed separately from the pads, and thus the number of pins may be reduced.

6 Claims, 10 Drawing Sheets

[Related Art]

COG-TYPED ORGANIC ELECTROLUMINESCENT CELL

CROSS-REFERENCE TO RELATED APPLICATIONS

This application claims priority from Korean Patent Application Nos. 2004-64638 and 2004-64639, filed on Aug. 17, 2004, the contents of which are incorporated herein by reference in their entirety.

BACKGROUND OF THE INVENTION

1. Field of the Invention

The present invention relates to a COG-typed organic electroluminescent cell. More particularly, the present invention relates to a COG-typed organic electroluminescent device including dummy data lines formed at different location from data lines.

2. Description of the Related Art

The organic electroluminescent cell emits a light having a predetermined wavelength when a certain voltage is applied thereto, as self-light emitting device. The organic electroluminescent cell includes a Chip On Film typed organic electroluminescent cell (hereinafter, referred to as "COF-typed organic electroluminescent cell") and a Chip On Glass typed organic electroluminescent cell (hereinafter, referred to as "COG-typed organic electroluminescent cell").

In the COF-typed organic electroluminescent cell, scan line pads are formed toward its exterior. However, in the COG-typed organic electroluminescent cell, a plurality of scan line pads are formed toward its interior.

FIG. 1A is a plan view illustrating a substrate including a conventional COG-typed organic electroluminescent cell.

In FIG. 1A, the substrate includes the organic electroluminescent cells, and each of the cells includes indium tin oxide films (hereinafter, referred to as "ITO films"), metal line layers, data line pads, and scan line pads. Hereinafter, the elements of the cell will be explained in more detail with reference to the accompanying drawings.

FIG. 1B is a plan view illustrating enlarged A section of FIG. 1A.

In FIG. 1B, the cell includes a cell section 10, data line pads 30, first scan line pads 50, and second scan line pads 70.

The cell section 10 includes a plurality of pixels formed in the luminescent areas which are cross areas of the ITO films and the metal line layers.

The data line pads 30 are connected to the ITO films, and provide the ITO films with a first voltage applied from a defect-detecting apparatus in case of detecting defect of the pixels.

The first scan line pads 50 are connected to a part of the metal line layers, and provide the part with a second voltage applied from the defect-detecting apparatus in case of detecting defect of the pixels.

The second scan line pads 70 are connected to the other metal line layers, and provide the other metal line layers with the second voltage in case of detecting defect of the pixels.

Hereinafter, the COG-typed organic electroluminescent cell and the COF-typed organic electroluminescent cell will be compared in detail.

In the COF-typed organic electroluminescent cell, defect of the pixels is detected by using connecting sections for connecting pads. Subsequently, the ends of the pads are cut off by a scribing blade so as to combine an integrated circuit chip with the pads. This is possible because the connecting sections are formed outside the cell in the COF-typed organic electroluminescent cell.

However, in the COG-typed organic electroluminescent cell, connecting sections for connecting pads 30, 50 and 70 could not be formed on the cell. This is because scan lines are cut off by a scribing blade with the ends of the pads in the scribing process, in case that the connecting sections are formed on the cell.

Accordingly, in the COG-typed organic electroluminescent cell, the pins of the defect-detecting apparatus each should be contacted to the pads 30, 50 and 70. As a result, many pins are required for detecting defect of the pixels, and the pads 30, 50 and 70 could be broken down by the contacted pins. Hence, a COG-typed organic electroluminescent cell capable of reducing the number of pins has been required.

SUMMARY OF THE INVENTION

It is a feature of the present invention to provide a COG-typed organic electroluminescent cell capable of reducing the number of pins for detecting defect of the pixels.

A COG-typed organic electroluminescent cell having a plurality of pixels formed in the luminescent areas which are cross areas of indium tin oxide films (ITO films) and metal line layers according to one embodiment of the present invention includes a plurality of data line pads, a plurality of dummy data lines, and a dummy data line connecting section. The data line pads each are connected to one end of the ITO films. The dummy data lines each are connected to the other end of the ITO films. The dummy data line connecting section connects the dummy data lines.

A COG-typed organic electroluminescent cell having a plurality of pixels formed in the luminescent areas which are cross areas of indium tin oxide films (ITO films) and metal line layers according to another embodiment of the present invention includes a plurality of data line pads, a plurality of dummy data lines, a dummy data line connecting section, a plurality of scan line pads, a plurality of dummy scan lines, and a dummy scan line connecting section. The data line pads each are connected to one end of the ITO films. The dummy data lines each are connected to the other end of the ITO films. The dummy data line connecting section connects the dummy data lines. The scan line pads each are connected to one end of the metal line layers. The dummy scan lines each are connected to the other end of the metal line layers. The dummy scan line connecting section connects the dummy scan lines.

As described above, the COG-typed organic electroluminescent cell of the present invention includes a dummy data line connecting section for connecting dummy data lines, and thus a pin of the defect-detecting apparatus may be contacted to one of dummy data lines so as to detect defect of the pixels. Accordingly, the number of pin required for detecting defect of the pixels may be reduced.

Also, in COG-typed organic electroluminescent cell of the present invention, dummy lines for detecting defect of the pixels are formed separately from pads, and thus the number of pins may be reduced. Moreover, the dummy lines and the connecting sections may be cut off by a scribing blade.

BRIEF DESCRIPTION OF THE DRAWINGS

The above and other features and advantages of the present invention will become readily apparent by reference to the following detailed description in conjunction with the accompanying drawings wherein.

DESCRIPTION OF EMBODIMENTS

Hereinafter, the preferred embodiments of the present invention will be explained in more detail with reference to the accompanying drawings.

Figure 1A:
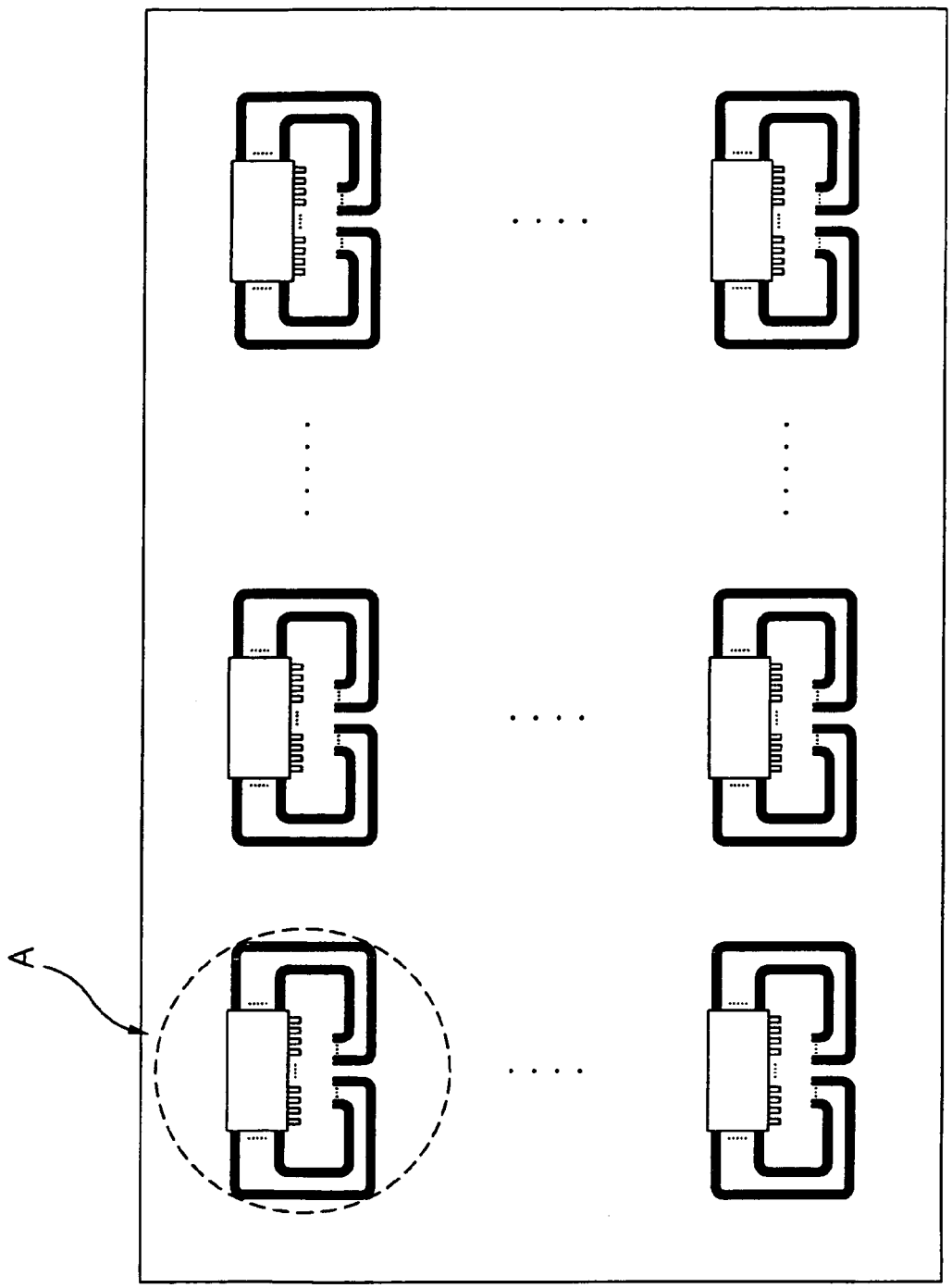
FIG. 1A is a plan view illustrating a substrate including a conventional COG-typed organic electroluminescent cell.
Figure 1B:
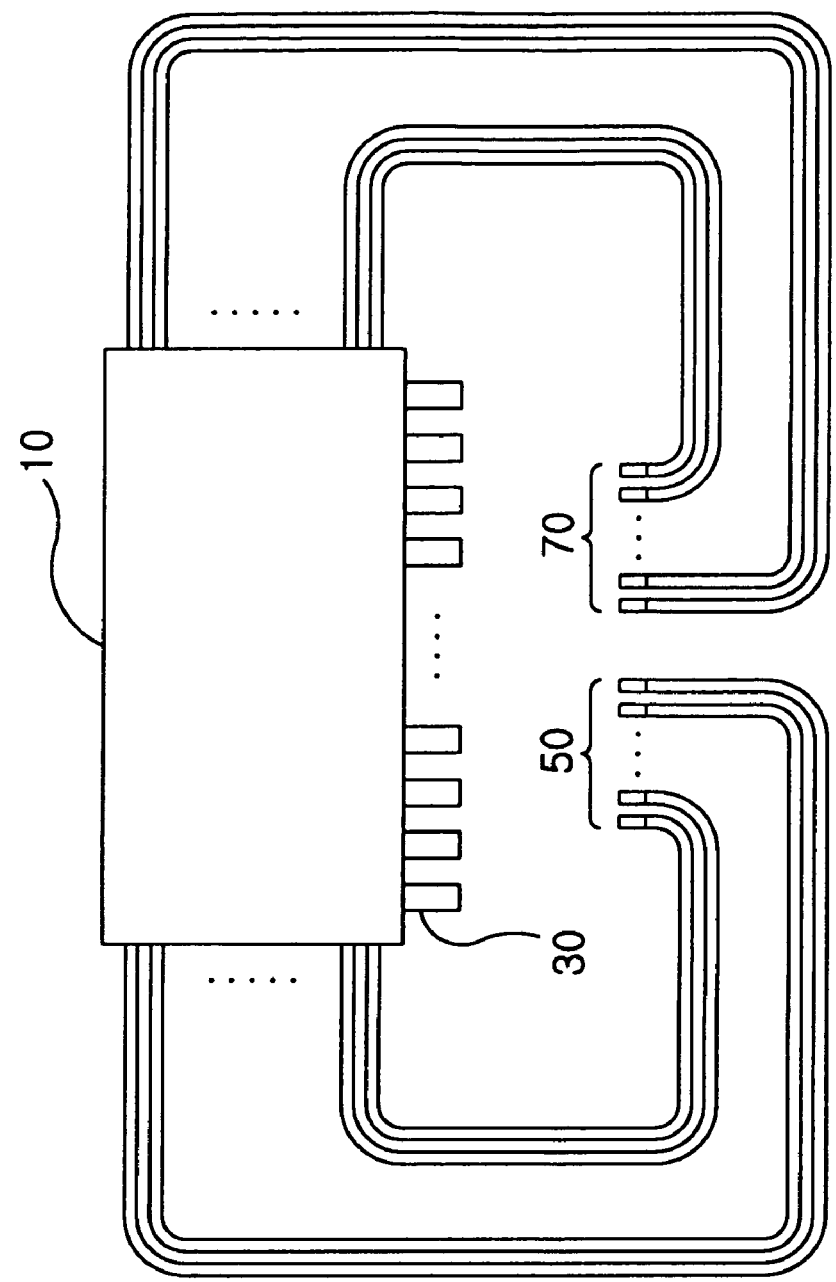
FIG. 1B is a plan view illustrating A section of FIG. 1A.
Figure 2A:
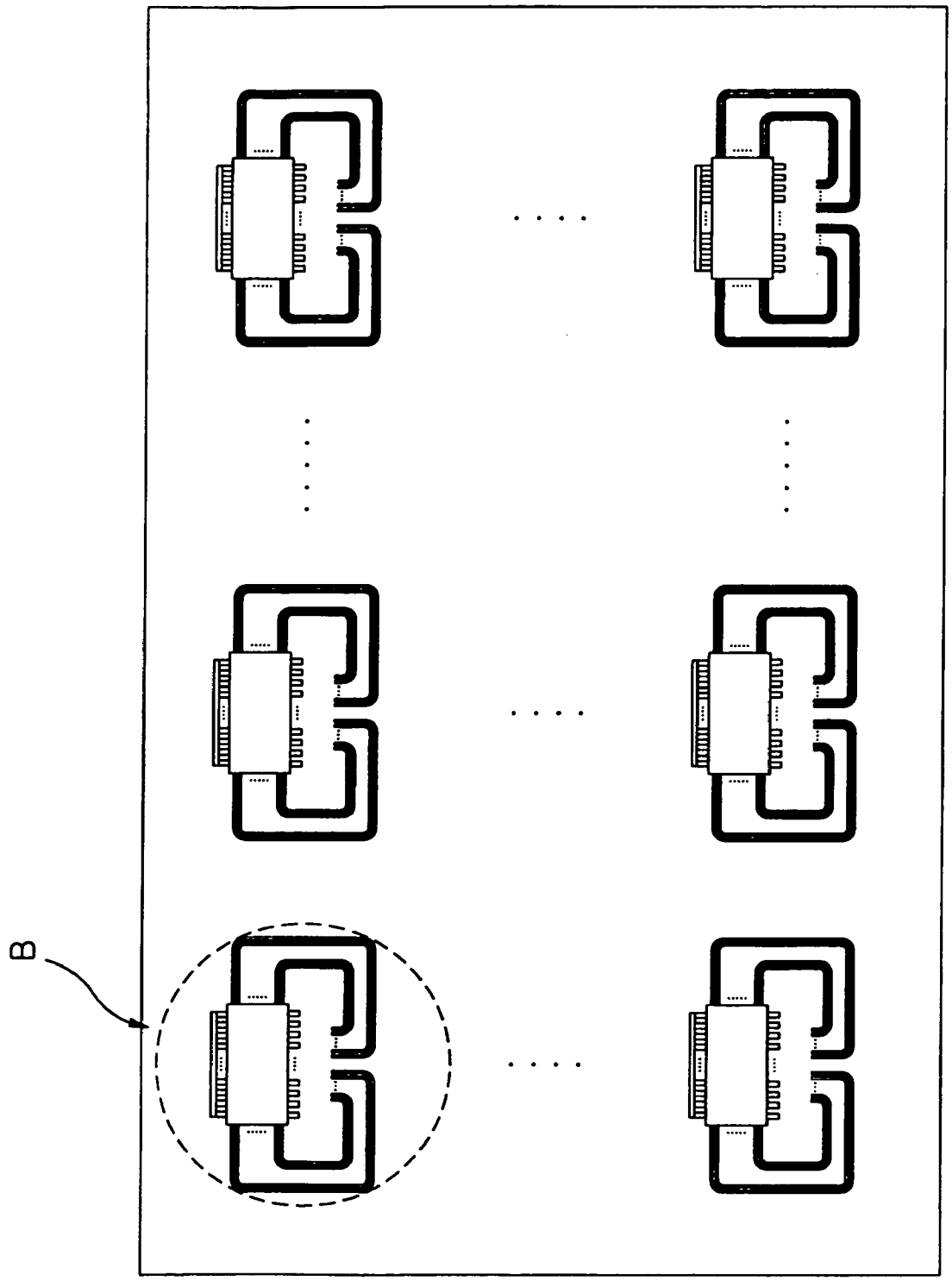
FIG. 2A is a plan view illustrating a substrate including COG-typed organic electroluminescent cells according to a first embodiment of the present invention.

FIG. 2A is a plan view illustrating a substrate including COG-typed organic electroluminescent cells according to a first embodiment of the present invention.

In FIG. 2A, each of the cells includes data line pads, dummy data lines, a dummy data line connecting section, first scan line pads, and second scan line pads. Hereinafter, the elements of the cells will be explained in more detail with reference to the accompanying drawings.

Figure 2B:
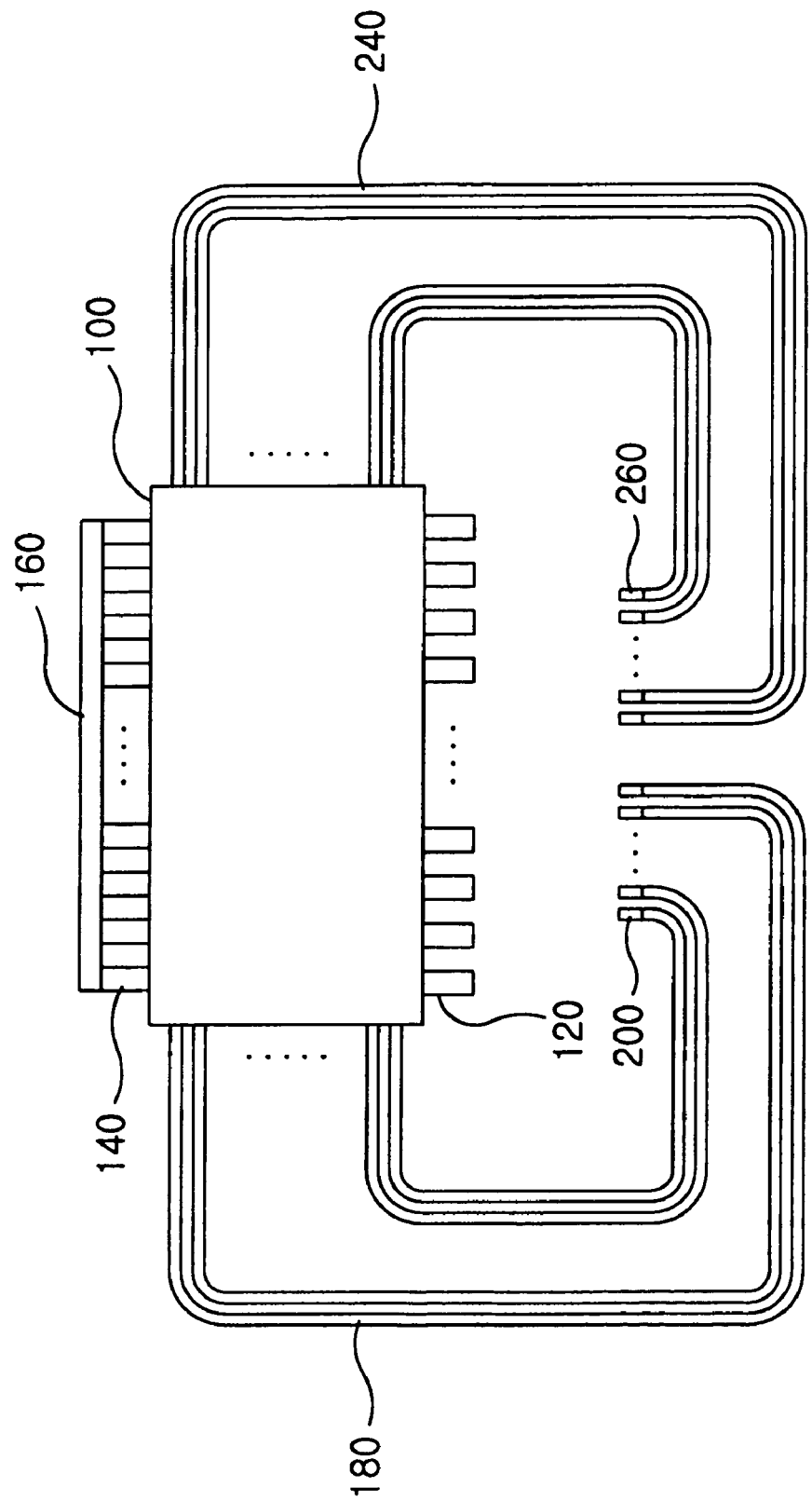
FIG. 2B is a plan view illustrating enlarged B section in FIG. 2A.

FIG. 2B is a plan view illustrating enlarged B section in FIG. 2A.

In FIG. 2B, the cell of the present invention includes a cell section 100, data line pads 120, dummy data lines 140, a dummy data line connecting section 160, first scan lines 180, first scan line pads 200, second scan lines 240, and second scan line pads 260.

The cell section 100 includes a plurality of pixels formed in the luminescent areas which are cross areas of indium tin oxide films (hereinafter, referred to as "ITO films") and metal line layers. Each of the pixels includes the ITO film, an organic layer, and the metal line layer, deposited in sequence on the substrate. Here, the organic layer includes a hole transporting layer (HTL), an emitting layer (EML), and an electron transporting layer (ETL), deposited in sequence on the ITO film.

In case that a positive voltage and a negative voltage are applied to the ITO film and the metal line layer, respectively, the HTL transports holes provided from the ITO film into the EML, and the ETL transports electrons provided from the metal line layer into the EML. Subsequently, the holes and the electrons are recombined in the EML, and so a light having a certain wavelength is emitted from the EML.

The data line pads 120 each are connected to one end of the ITO films, and are connected to an integrated circuit chip for driving the pixels after detecting defect of the pixels.

The dummy data lines 140 each are connected to the other end of the ITO films, and are used for detecting defect of the pixels. In particular, the dummy data lines 140 provide a first voltage through the dummy data line connecting section 160 from the defect-detecting apparatus to the ITO films when defect of the pixels is detected. In addition, the ends of the dummy data lines 140 are cut off by a scribing blade after detecting defect of the pixels.

The dummy data line connecting section 160 connects the dummy data lines 140 as electric conductor.

The first scan line pads 200 are connected to a part of the metal line layers through the first scan lines 180, and provide a second voltage from the defect-detecting apparatus to the part when defect of the pixels is detected.

The second scan line pads 260 are connected to the other metal line layers through the second scan lines 240, and provide the second voltage from the defect-detecting apparatus to the other metal line layers when defect of the pixels is detected.

The integrated circuit chip is connected on the data line pads 120, and the scan line pads 200 and 260 after defect of the pixels is detected.

In the COG-typed organic electroluminescent cell of the present invention, the dummy data line connecting section 160 connects the dummy data lines 140. Hence, though one pin of the defect-detecting apparatus is contacted to one of the dummy data lines 140, the first voltage may be applied to the ITO films unlike the conventional art. In other words, the number of pins required for detecting defect of the pixels in the prior art may be reduced in the present invention.

In an organic electroluminescent cell according to another embodiment of the present invention, scan lines may not be formed in two directions, as shown in FIG. 2B, and can be formed in one direction. As a result, the metal line layers may be connected to scan line pads corresponding to the scan lines in one direction.

Figure 2C:
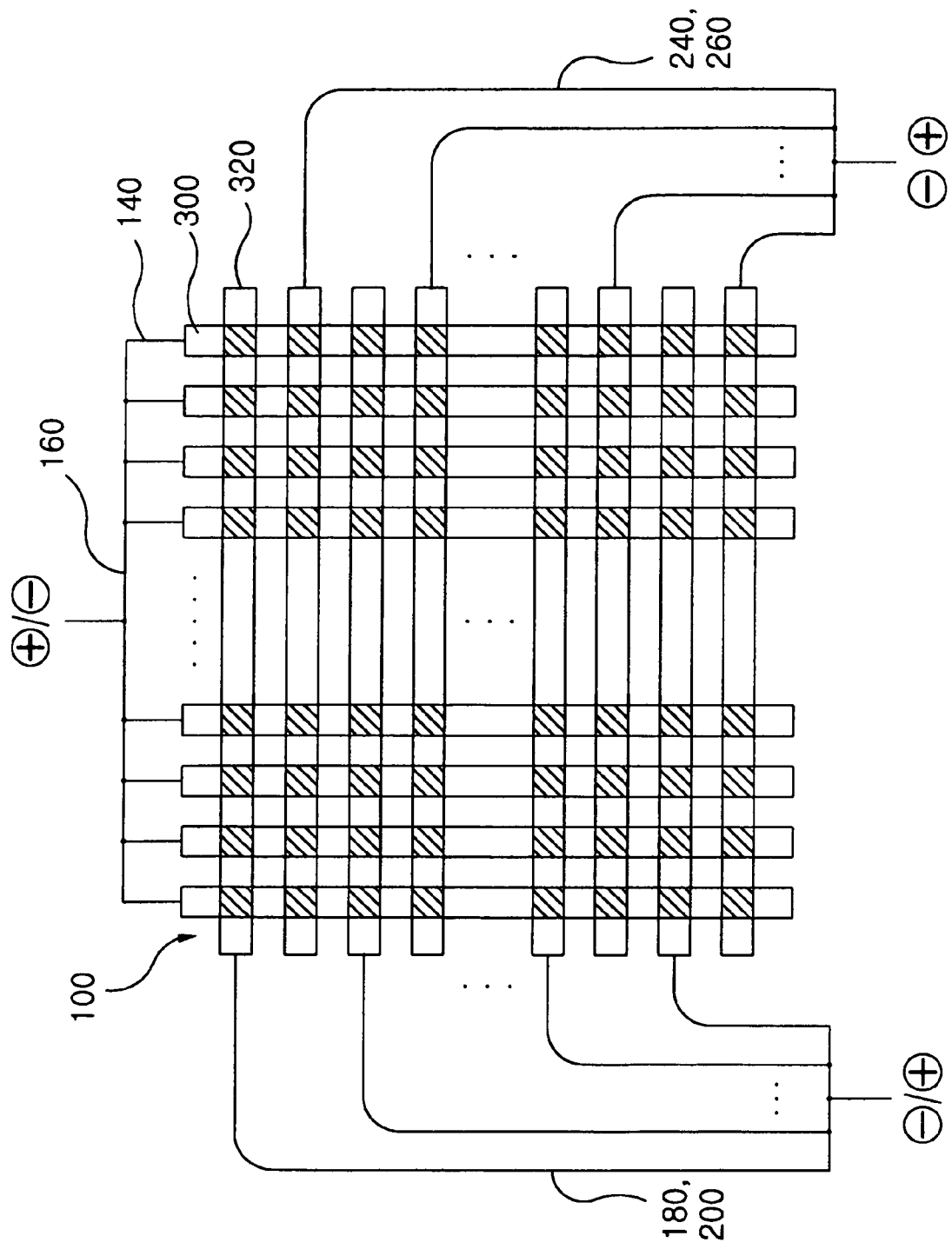
FIG. 2C is a plan view illustrating the cell section of FIG. 2B.

FIG. 2C is a plane view illustrating the cell section of FIG. 2B.

In FIG. 2C, the cell section 100 includes the pixels formed in the luminescent areas which are cross areas of the ITO films 300 and the metal line layers 320.

Hereinafter, the process of detecting defect of the pixels will be described in detail.

First, the process of detecting lighting defect of the pixels will be described.

A first pin of the defect-detecting apparatus is contacted to one of the dummy data lines 140, and then a positive voltage is applied to the one of the dummy data lines 140 through the first pin from the defect-detecting apparatus. Additionally, second pin of the defect-detecting apparatus are contacted to the first scan line pads 200, and then a negative voltage is applied to the first scan line pads 200 through the second pins from the defect-detecting apparatus. Moreover, third pins of the defect detecting apparatus are contacted to the second scan line pads 260, and then the negative voltage is applied to the second scan line pads 260 through the third pins from the defect-detecting apparatus. Subsequently, the applied positive voltage is provided to the other dummy data lines through the dummy data line connecting section 160, and then the provided positive voltage is provided to the ITO films 300 through the dummy data lines 140. In addition, the negative voltage is provided to odd number metal line layers through the first scan line pads 200 and the first scan lines 180, as shown in FIG. 2C, and is provided to even number metal line layers through the second scan line pads 260 and the second scan lines 240. As a result, a light is emitted from the pixels. In this case, the defect-detecting apparatus detects the lighting defect of the pixels through the emitted light.

Second, the process of detecting leakage current is described in detail.

A first pin of the defect detecting apparatus is contacted to one of the dummy data lines 140, and then a negative voltage is applied to the one of the dummy data lines 140 through the first pin from the defect-detecting apparatus. Additionally, second pins of the defect detecting apparatus are contacted to the first scan line pads 200, and then a positive voltage is applied to the first scan line pads 200 through the second pins from the defect-detecting apparatus. Moreover, third pins of the defect detecting apparatus are contacted to the second scan line pads 260, and then the positive voltage is applied to the second scan line pads 260 through the third pins from the defect-detecting apparatus. Subsequently, the applied negative voltage is provided to the other dummy data lines through the dummy data line connecting section 160, and then the provided negative voltage is provided to the ITO films 300 through the dummy data lines 140. In addition, the positive voltage is provided to odd number metal line layers through the first scan line pads 200 and the first scan lines 180, as shown in FIG. 2C, and is provided to even number metal line layers through the second scan line pads 260 and the second scan lines 240. In case that the pixels do not have defect, a reverse voltage is applied to the pixels, and so no leakage current passes through the pixels. Only, in fact, a fine current may pass through the pixels. However, in case that the pixels have defect, for example, a part of the pixels is short, a leakage current passes through the pixels having the defect. In this case, the defect-detecting apparatus measures the leakage current passing through the pixels to determine that the pixels have defect.

The organic electroluminescent cell of the present invention includes the dummy data line connecting section 160, and thus when defect of the pixels is detected, to apply a certain voltage to the ITO films, it is enough for a pin of the defect-detecting apparatus to contact one of the dummy data lines 140. Therefore, the organic electroluminescent cell may reduce the number of pins required for detecting defect of the pixels compared with the conventional cell.

Figure 3:
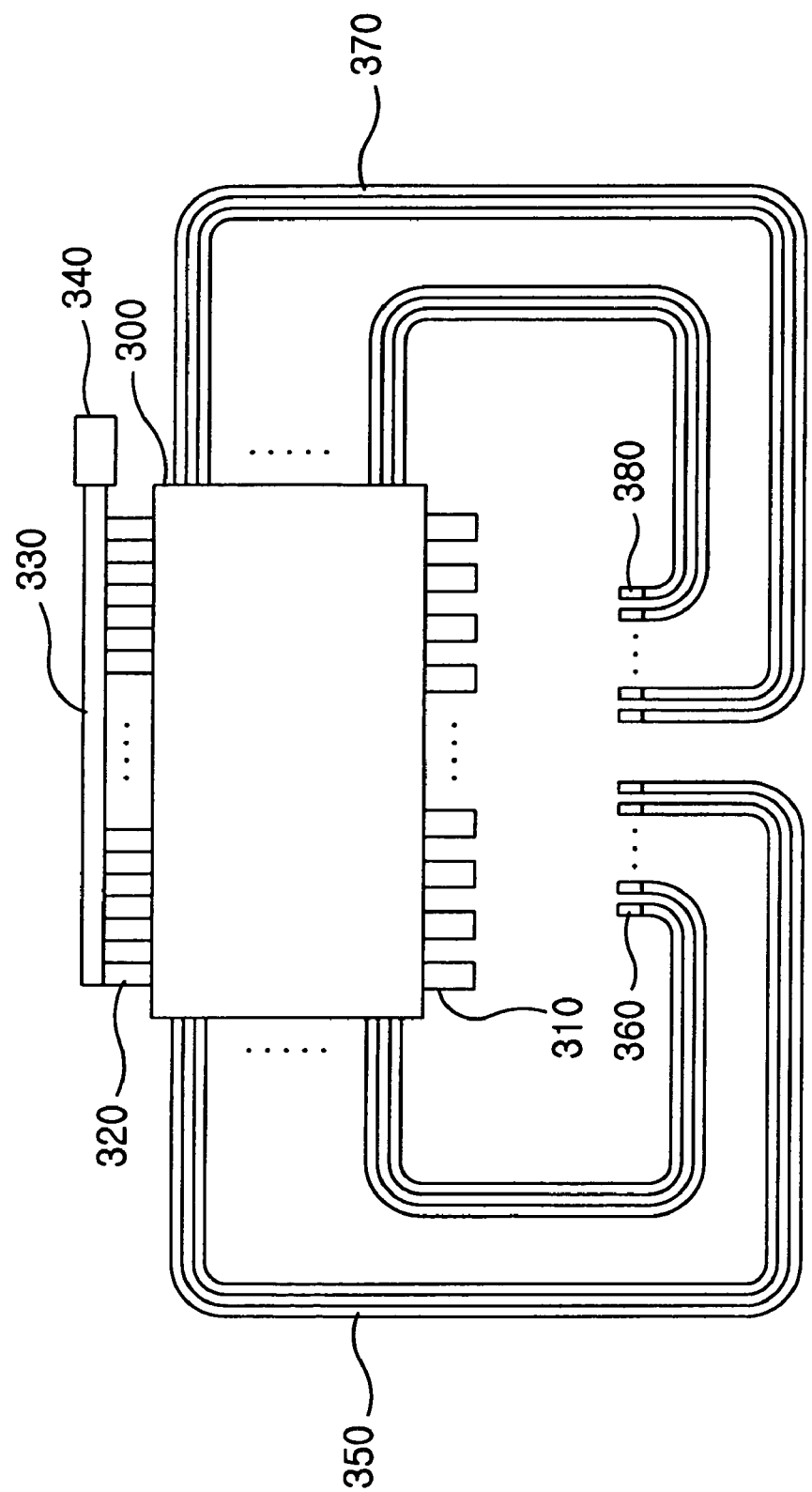
FIG. 3 is a plan view illustrating a COG-typed organic electroluminescent cell according to a second embodiment of the present invention.

FIG. 3 is a plan view illustrating a COG-typed organic electroluminescent cell according to the second embodiment of the present invention.

In FIG. 3, the organic electroluminescent cell of the present invention includes a cell section 300, data line pads 310, dummy data lines 320, a dummy data line connecting section 330, a data line electrode section 340, first scan lines 350, first scan line pads 360, second scan lines 370, and second scan line pads 380.

Since the elements of the present embodiment except the data line electrode section 340 are the same as in the first embodiment, any further detailed descriptions concerning the same elements will be omitted.

The data line electrode section 340 is connected to the dummy data line connecting section 330. A first pin of the defect-detecting apparatus is contacted to the data line electrode section 340, and then a certain voltage is applied to the data line electrode section 340 through the first pin from the defect-detecting apparatus. Subsequently, the data line electrode section 340 provides the applied voltage to the ITO films through the dummy data line connecting section 330 and the dummy data lines 320. Here, the data line electrode section 340 is an electric conductor, for example, metal.

In the organic electroluminescent cell according to the second embodiment, the pin is not contacted to the data line pads 310 but contacted to the data line electrode section 340, and so the data line pads 310 are not broken down.

Figure 4A:
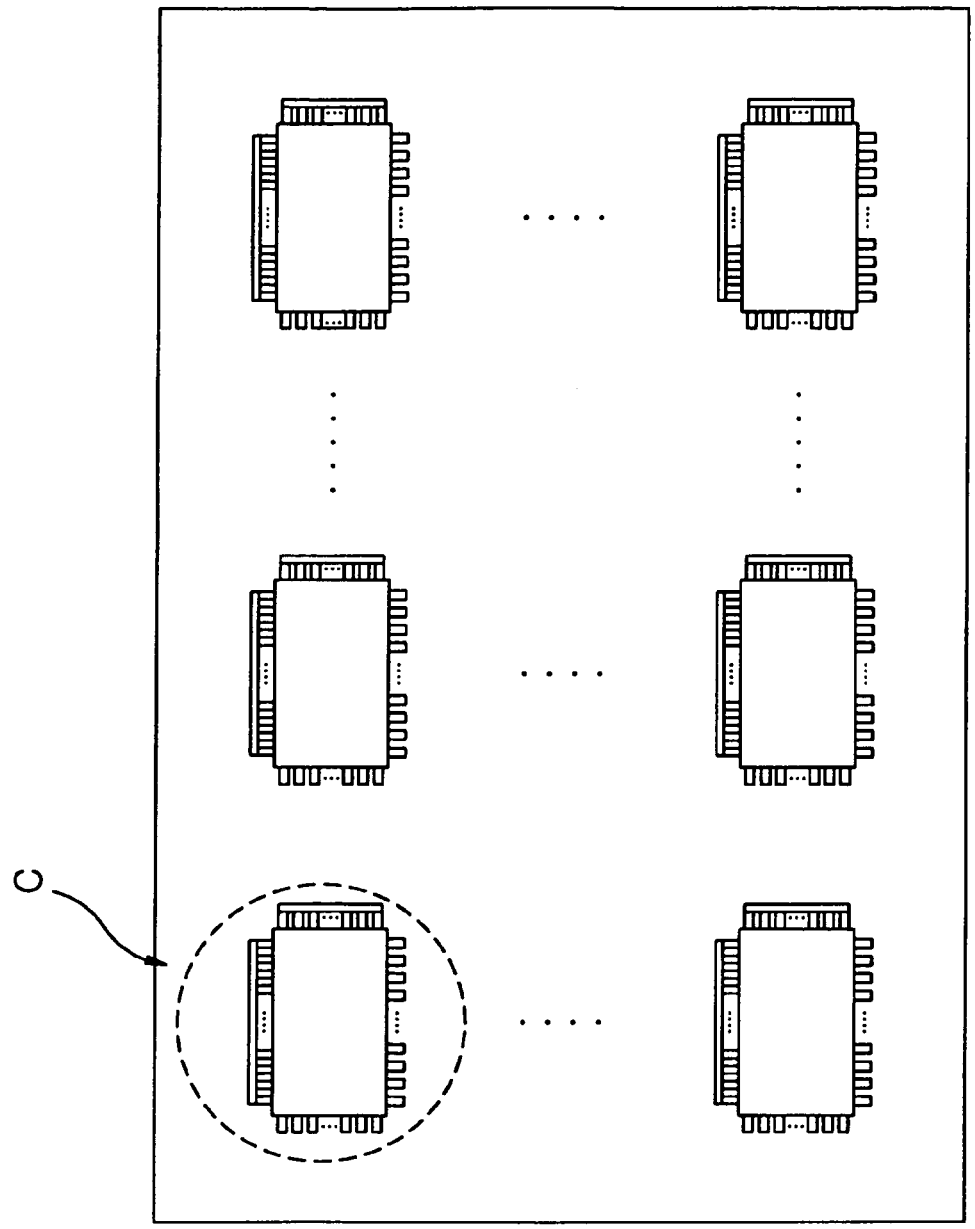
FIG. 4A is a plan view illustrating a substrate including a COG-typed organic electroluminescent cell according to a third embodiment of the present invention.

FIG. 4A is a plan view illustrating a substrate including a COG-typed organic electroluminescent cell according to the third embodiment of the present invention.

In FIG. 4A, each of the cells includes data line pads, dummy data lines, a dummy data line connecting section, scan line pads, dummy scan lines, and dummy scan line connecting sections. Hereinafter, the elements of the cells will be explained in more detail with reference to the accompanying drawings.

Figure 4B:
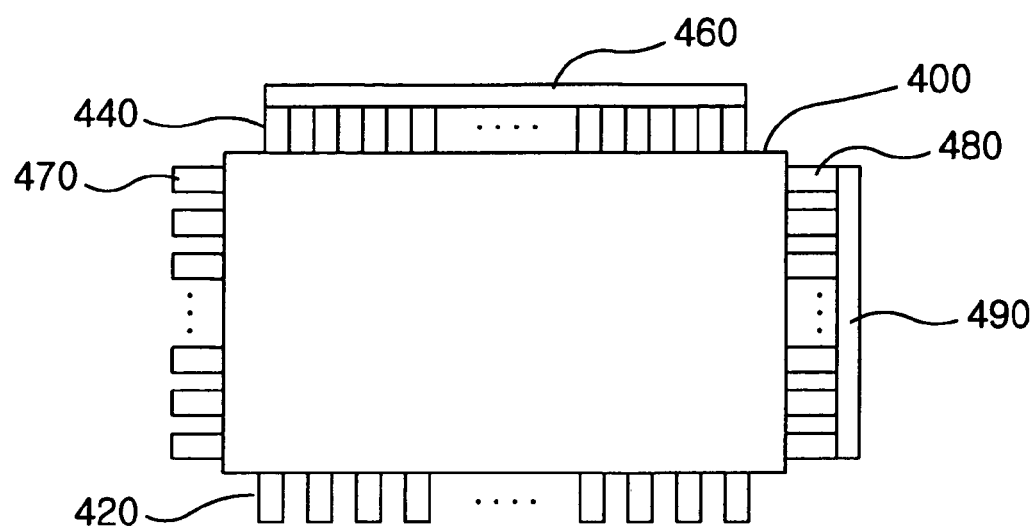
FIG. 4B is a plan view illustrating enlarged C section in FIG. 4A.

FIG. 4B is a plan view illustrating enlarged C section in FIG. 4A.

In FIG. 4B, the cell of the present invention includes a cell section 400, data line pads 420, dummy data lines 440, a dummy data line connecting section 460, scan line pads 470, dummy scan lines 480, and a dummy scan line connecting section 490.

The cell section 400 includes a plurality of pixels formed in the luminescent areas which are cross areas of ITO films and metal line layers. Here, each of the pixels includes the ITO film, an organic layer, and the metal line layer, deposited in sequence on the substrate.

The data line pads 420 each are connected to one end of the ITO films, and are connected to anode electrode sections in an integrated circuit chip.

The dummy data lines 440 each are connected to the other end of the ITO films, and provide a certain voltage applied through the dummy data line connecting section 460 from the defect-detecting apparatus to the ITO films when defect of the pixels is detected. In particular, the voltage is applied to one of the dummy data lines 440 from the defect-detecting apparatus, and then the applied voltage is provided to the other dummy data lines through the dummy data line connecting section 460. In addition, the dummy data lines 400 are electric conductors such as metal, ITO film, etc.

The ends of the dummy data lines 440 are cut off by a scribing blade after detecting defect of the pixels.

The dummy data line connecting section 460 provides the voltage applied from one of the dummy data lines 440 to the other dummy data lines as electric conductor.

The scan line pads 470 each are connected to one end of the metal line layers, and are connected to cathode electrode sections in the integrated circuit chip after detecting defect of the pixels.

The dummy scan lines 480 each are connected to the other end of the metal line layers, and provide a certain voltage applied through the dummy scan line connecting section 490 from the defect-detecting apparatus to the metal line layers. Particularly, the voltage is applied to one of the dummy scan lines 480 from the defect-detecting apparatus, and then the applied voltage is provided to the other dummy scan lines through the dummy scan line connecting section 490. Additionally, the dummy scan lines 480 are electric conductors.

Each end of the dummy scan lines 480 is cut off by a scribing blade after detecting defect of the pixels.

The dummy scan line connecting section 490 provides the voltage applied from one of the dummy scan lines 480 to the other dummy scan lines as electric conductor.

In short, in the COG-typed organic electroluminescent cell, a first pin is contacted to one of the dummy data lines 440, and a second pin is contacted to one of the dummy scan lines 480 so as to detect defect of the pixels. In other words, two pins are required for detecting defect of the pixels, and thus the number of pins required for detecting defect of the pixels may be reduced in the present invention, compared with the conventional art.

Figure 4C:
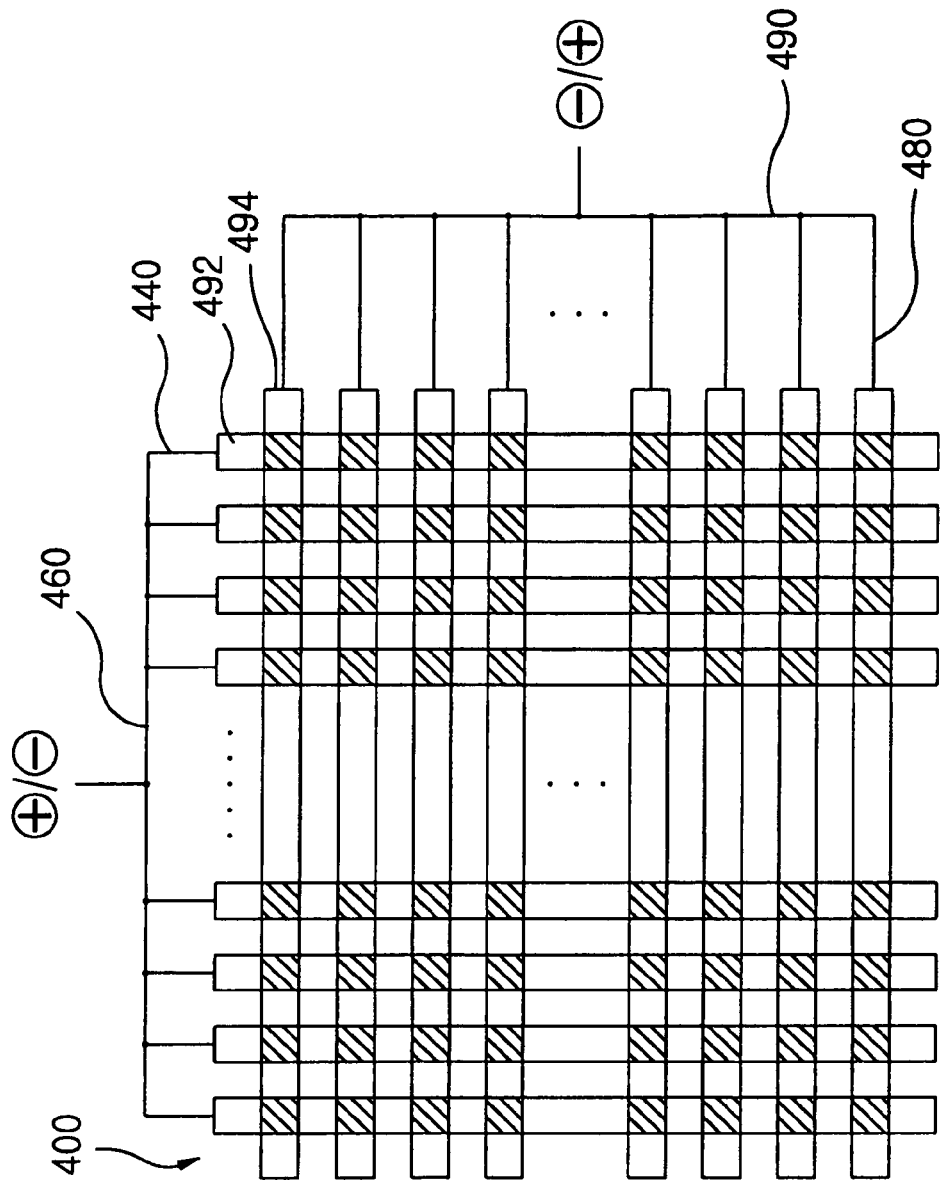
FIG. 4C is a plan view illustrating the cell section of FIG. 4B.

FIG. 4C is a plane view illustrating the cell section of FIG. 4B.

In FIG. 4C, the cell section 400 includes a plurality of pixels formed in the luminescent areas which are cross areas of ITO films 492 and metal line layers 494.

Hereinafter, the process of detecting defect of the pixels will be described in detail.

First, the process of detecting lighting defect of the pixels will be described.

A first pin of the defect-detecting apparatus is contacted to one of the dummy data lines 440, and then a positive voltage is applied to the one of the dummy data lines 440 through the first pin. In addition, a second pin is contacted to one of the dummy scan lines 480, and then a negative voltage is applied to the one of the dummy scan lines 480 through the second pin. Subsequently, the applied positive voltage is provided to the other dummy data lines through the dummy data line connecting section 460, and the applied negative voltage is provided to the other dummy scan lines through the dummy scan line connecting section 490. Then, the provided positive voltage is provided to the ITO films 492 through the dummy data lines 440, and the provided negative voltage is provided to the metal line layers 494 through the dummy scan lines 480. As a result, a light having a certain wavelength is emitted from the pixels. In this case, the defect-detecting apparatus detects lighting defect of the pixels through the emitted light.

Second, the process of detecting a leakage current is described in detail.

A first pin of the defect-detecting apparatus is contacted to one of the dummy data lines 440, and then a negative voltage is applied to the one of the dummy data lines 440 through the first pin. In addition, a second pin is contacted to one of the dummy scan lines 480, and then a positive voltage is applied to the one of the dummy scan lines 480 through the second pin. Subsequently, the applied negative voltage is provided to the other dummy data lines through the dummy data line connecting section 460, and the applied positive voltage is provided to the other dummy scan lines through the dummy scan line connecting section 490. Then, the provided negative voltage is provided to the ITO films 492 through the dummy data lines 440, and the provided positive voltage is provided to the metal line layers through the dummy scan lines 480. In case that the pixels do not have defect, a reverse voltage is applied to the pixels, and so no leakage current passes through the pixels. Only, in fact, a fine current may pass through the pixels. However, in case that the pixels have defect, for example, a part of the pixels is short, a leakage current passes through the pixels having the defect. In this case, the defect-detecting apparatus measures the leakage current passing through the pixels to detect the defect of the pixels.

In brief, the pins of the defect-detecting apparatus are not contacted to the pads 420 and 470 but contacted to the connecting sections 460 and 490, and so the pads 420 and 470 may not be broken down.

Figure 5:
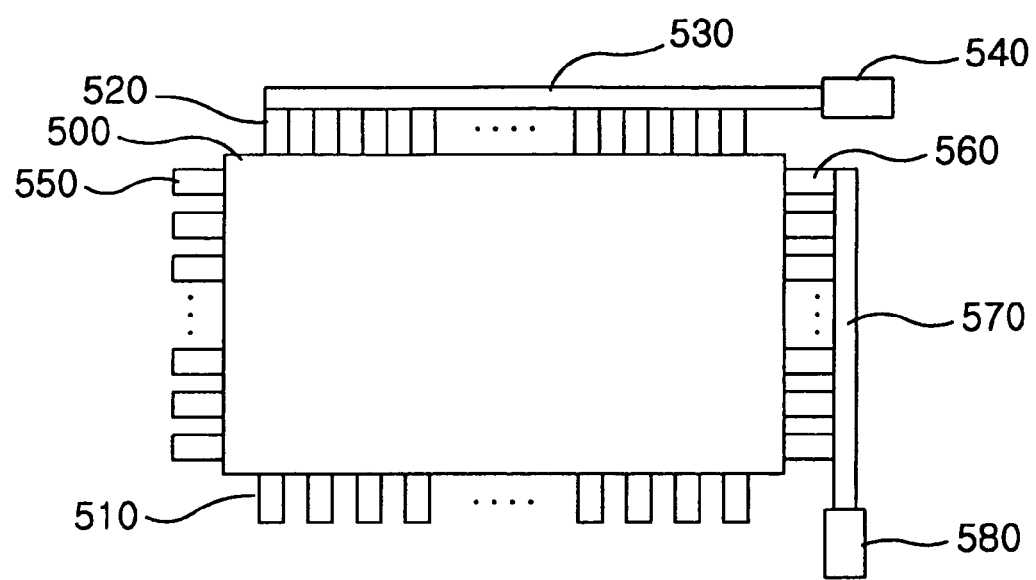
FIG. 5 is a plan view illustrating a COG-typed organic electroluminescent cell according to a fourth embodiment of the present invention.

FIG. 5 is a plan view illustrating a COG-typed organic electroluminescent cell according to the fourth embodiment of the present invention.

In FIG. 5, the cell of the present invention includes a cell section 500, data line pads 510, dummy data lines 520, a dummy data line connecting section 530, a data line electrode section 540, scan line pads 550, dummy scan lines 560, a dummy scan line connecting section 570, and a scan line electrode section 580.

Since the elements of the present embodiment except the electrode sections 540 and 580 are the same as in the third embodiment, any further detailed descriptions concerning the same elements will be omitted The data line electrode section 540 is connected to the dummy data line connecting section 530, and provides a certain voltage applied through a first pin of the defect-detecting apparatus to ITO films through the dummy data line connecting section 530 and the dummy data lines 520. Here, the data line electrode section 540 is an electric conductor.

The scan line electrode section 580 is connected to the dummy scan line connecting section 570, and provides a certain voltage applied through a second pin of the defect-detecting apparatus to metal line layers through the dummy scan line connecting section 570 and the dummy scan lines 560. Here, the scan line electrode section 580 is an electric conductor.

In brief, the pins of the defect-detecting apparatus are not contacted to the pads 510 and 550 but contacted to the electrode sections 540 and 580, and so the pads 510 and 550 may not be broken down.

Moreover, the voltages applied from the defect detecting apparatus are provided to the dummy data lines 520 and the dummy scan lines 560 through the electrode sections 540 and 580. Hence, an identical first voltage is applied to the dummy data lines 520, and an identical second voltage is applied to the dummy scan lines 560. Accordingly, defect of the pixels in the cell of the present invention may be detected more accurately than in a conventional cell.

From the preferred embodiments for the present invention, it is noted that modifications and variations can be made by a person skilled in the art in light of the above teachings. Therefore, it should be understood that changes may be made for a particular embodiment of the present invention within the scope and spirit of the present invention outlined by the appended claims.

What is claimed is:

1. A COG-typed organic electroluminescent cell having a plurality of pixels formed in luminescent areas of the cell and which are cross areas of indium tin oxide films (ITO films) and metal line layers, comprising:
    a plurality of data line pads, each connected to one end of the ITO films;
    a plurality of dummy data lines, each connected to the other end of the ITO films opposite to the one end of the ITO films;
    a dummy data line connecting section connected to the plurality of dummy data lines; and
    a data line electrode section connected to the dummy data line connecting section and configured to provide a predetermined voltage, applied from a defect detecting apparatus, to the dummy data lines through the dummy data line connecting section.

2. The COG-typed organic electroluminescent cell of claim 1, wherein the dummy data line connecting section is an electric conductor.

3. The COG-typed organic electroluminescent cell of claim 1, wherein ends of die dummy data lines are cut off when the dummy data lines are connected to an integrated circuit chip.

4. The COG-typed organic electroluminescent cell of claim 1, further including:
    a plurality of first scan line pads connected to a part of the metal line layers; and
    a plurality of second scan line pads connected to the other metal line layers.

5. A COG-typed organic electroluminescent cell having a plurality of pixels formed in luminescent areas of the cell and which are cross areas of indium tin oxide films (ITO films) and metal line layers, comprising:
    a plurality of data line pads, each connected to one end of the ITO films;
    a plurality of dummy data lines each connected to the other end of the ITO films opposite to the one end of the ITO films;

a dummy data line connecting section connected to the plurality of dummy data lines;

a plurality of scan line pads each connected to one end of the metal line layers;

a plurality of dummy scan lines, each connected to an end of the metal line layers opposite to the one end of the metal line layers;

a dummy scan line connecting section connected to the plurality of dummy scan lines;

a data line electrode section connected to the dummy data line connecting section and configured to provide a first voltage, applied from a defect-detecting apparatus, to the ITO films through the dummy data line connection section and the dummy data lines; and a scan line electrode section connected to the dummy scan line connecting section and configured to provide a second voltage, applied from the defect-detecting apparatus, to the metal line layers through the dummy scan line connecting section and the dummy scan lines.

6. The COG-typed organic electroluminescent cell of claim 5, wherein each of the dummy data line connecting section and the dummy scan line connecting section is an electric conductor.

* * * * *